United States Patent
Low

(10) Patent No.: US 7,586,110 B1
(45) Date of Patent: Sep. 8, 2009

(54) TECHNIQUES FOR DETECTING ION BEAM CONTAMINATION IN AN ION IMPLANTATION SYSTEM AND INTERLOCKING SAME

(75) Inventor: Russell John Low, Rowley, MA (US)

(73) Assignee: Varian Semiconductor Equpment Associates, INc., Gloucester, MA (US)

( * ) Notice: Subject to any disclaimer, the term of this patent is extended or adjusted under 35 U.S.C. 154(b) by 350 days.

(21) Appl. No.: 11/694,304

(22) Filed: Mar. 30, 2007

(51) Int. Cl.
*H01L 21/425* (2006.01)
*H01J 37/317* (2006.01)
*G21K 5/08* (2006.01)

(52) U.S. Cl. .............. 250/492.21; 250/309; 250/492.3
(58) Field of Classification Search .......... 250/306, 250/309, 492.1, 492.2, 492.21, 492.22, 492.3
See application file for complete search history.

(56) References Cited

U.S. PATENT DOCUMENTS

| | | | |
|---|---|---|---|
| 6,313,475 B1 * | 11/2001 | Renau et al. ........... 250/492.21 |
| 6,323,497 B1 | 11/2001 | Walther | |
| 6,541,780 B1 * | 4/2003 | Richards et al. ........ 250/492.2 |
| 6,654,095 B1 * | 11/2003 | Nishi ..................... 355/30 |
| 6,757,051 B2 * | 6/2004 | Takahashi et al. ......... 355/67 |
| 6,797,967 B1 | 9/2004 | Tse et al. | |
| 7,078,712 B2 * | 7/2006 | Perel et al. ........... 250/492.21 |
| 7,402,820 B2 * | 7/2008 | Low et al. ............ 250/492.21 |
| 2007/0241276 A1 * | 10/2007 | Low et al. ................ 250/282 |

* cited by examiner

*Primary Examiner*—Bernard E Souw

(57) ABSTRACT

Techniques for detecting ion beam contamination in an ion implantation system and interlocking same are disclosed. An ion beam is generated. One or more ion detectors located at trajectories off of that of the ion beam. Ion current levels detected by the one or more off-trajectory detectors are used to calculate a level of ion beam charge contamination. If contamination exceeds a predetermined level, process interlock may occur to prevent dosimetry errors.

21 Claims, 5 Drawing Sheets

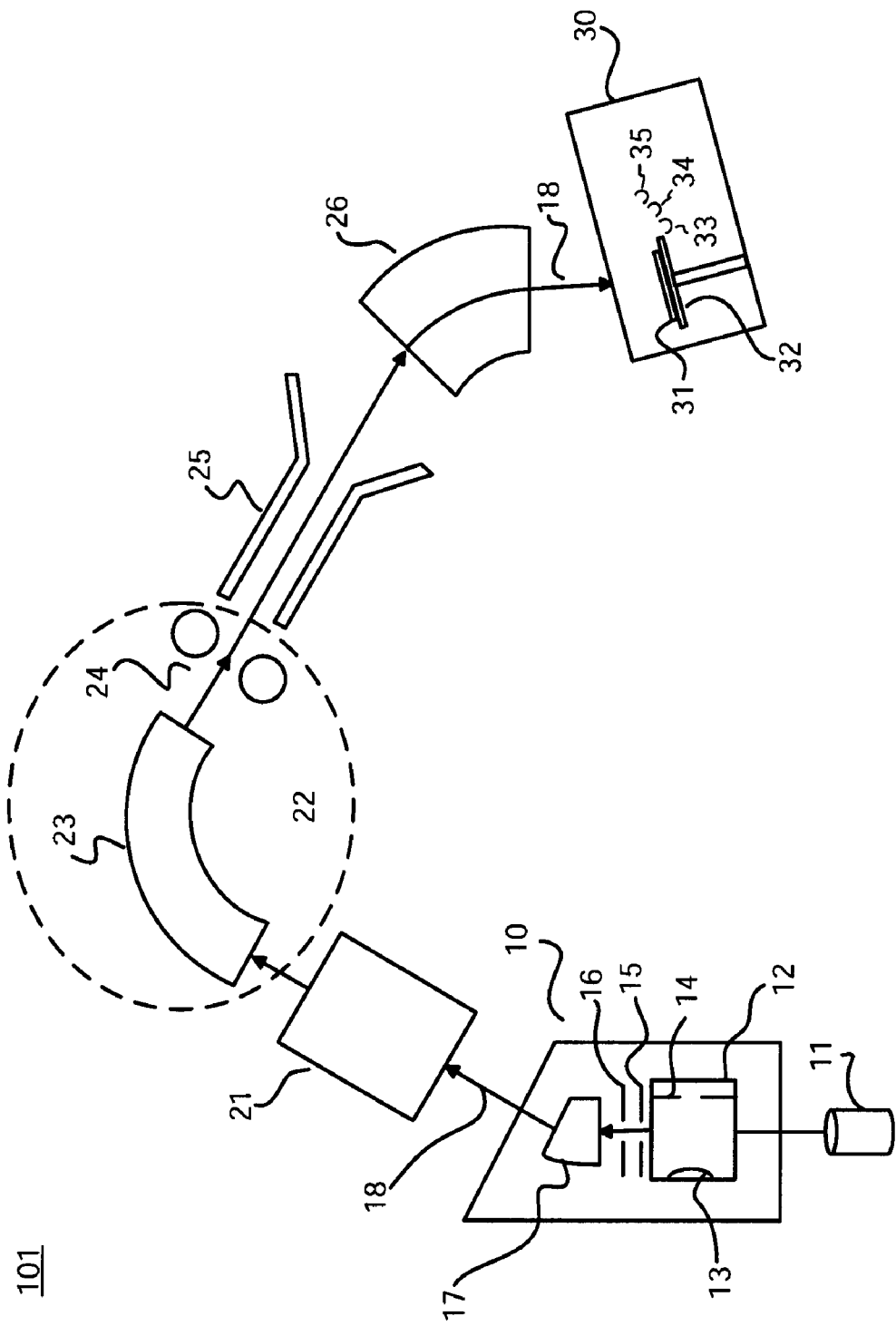

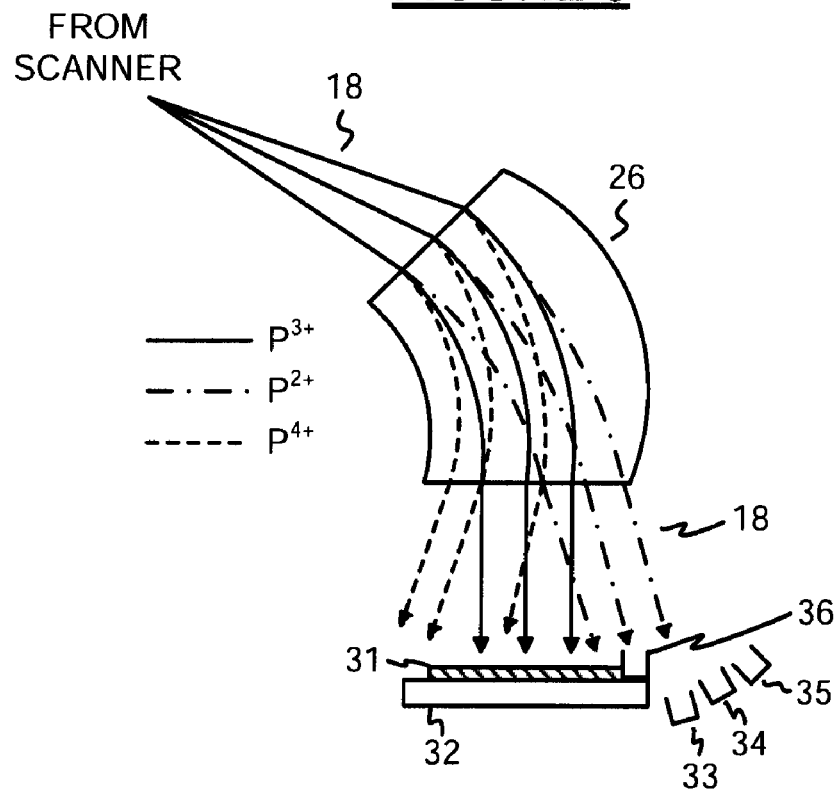
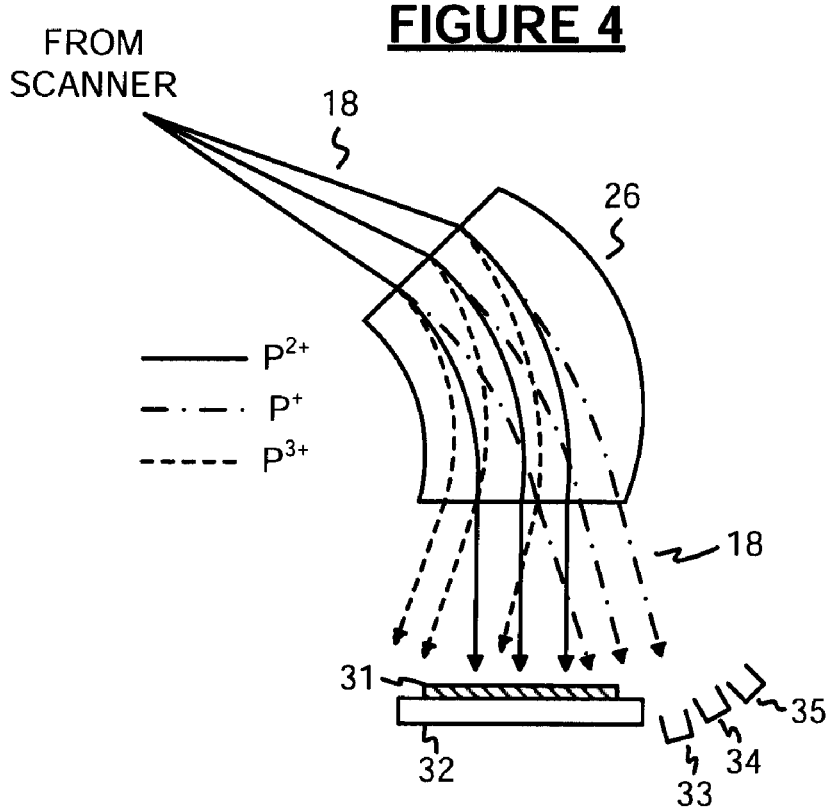

TECHNIQUES FOR DETECTING ION BEAM CONTAMINATION IN AN ION IMPLANTATION SYSTEM AND INTERLOCKING SAME

FIELD OF THE DISCLOSURE

The present disclosure relates generally to substrate processing techniques and more particularly, to techniques for detecting ion beam contamination in an ion implantation process and, if necessary, interlocking the ion implantation process to prevent substrate dosimetry errors.

BACKGROUND OF THE DISCLOSURE

In semiconductor manufacturing, ion implantation has become a standard technique for introducing conductivity-altering impurities into semiconductor wafers to produce various semiconductor-based products. Such ion implantation is used to change the material properties of portions of a semiconductor substrate. Specifically, during such ion implantation, a desired impurity material is ionized in an ion source, generated ions are accelerated to form an ion beam of a prescribed energy, and the ion beam is directed at the surface of the semiconductor substrate. The energetic ions in the ion beam penetrate into the bulk of the semiconductor substrate and are embedded into a crystalline lattice of the semiconductor substrate to form a region of desired conductivity.

It is essential during ion implantation to maintain uniform dosage at the semiconductor substrate. One factor that can effect dosage uniformity is ion charge exchange interactions in a beamline of the ion beam that can alter actual and detectable ion beam current levels reaching the semiconductor substrate, making the ion beam current at the semiconductor substrate difficult to accurately measure. When charged ion particles collide with each other or with other particles, they can undergo ionization or neutralization, thereby gaining or losing a charge state. It is known in the art that fluctuations in vacuum pressure in and around the ion beam will increase the likelihood of these ion charge exchange interactions. Unfortunately, fluctuations in vacuum pressure are common during ion implantation because of out-gassing caused by the ion beam contacting photoresist and/or other coatings on the semiconductor substrate. Out-gassing is a process by which gas particles are released when the ion beam hits the semiconductor substrate coatings. The release of these gas particles temporarily increases the pressure along the beamline and can cause the gas particles to collide with the ions in the ion beam causing them to change charge state. For example, double charged $P^{2+}$ ions may collide with a particle and neutralize to single charge $P^+$ ions. The effect of this on the semiconductor substrate may vary depending on where in the beamline the charge exchange interactions occur.

When performing ion implantation with multiple charged ions, such as, for example ion beams of $P^{2+}$, $P^{3+}$, or $P^{4+}$, the likelihood of charge exchange interactions increases. When an ion implantation process based on a $P^{3+}$ ion beam becomes contaminated, such as with $P^{2+}$ ions, the uniformity of the dosage on the semiconductor substrate may vary. Some of the $P^{2+}$ ions may impinge on the semiconductor substrate while others may travel on trajectories away from the semiconductor substrate. This variation may be difficult to detect in real time and may result in reduced yields. Thus, in view of the foregoing, it would be desirable to provide a technique for detecting ion beam contamination during ion implantation to prevent losses due to poor process control and which overcomes some or all of the inadequacies and shortcomings of known systems.

SUMMARY OF THE DISCLOSURE

Techniques for detecting ion beam contamination in an ion implantation system and interlocking same are disclosed. In one embodiment, the technique may be realized as a method of operating an ion implantation system. The method according to this embodiment may comprise generating an ion beam of a primary charge state, projecting the ion beam onto a target substrate, detecting off angle ions on trajectories off the target substrate, wherein a concentration of the off angle ions indicates an amount of charge contamination within the ion beam, and interlocking ion implantation when the amount of charge contamination exceeds or equals a predetermined threshold.

In another embodiment, the technique may be realized as a method of detecting ion beam contamination in an ion implantation system. The method according to this embodiment may comprise detecting ions on trajectories off of a target substrate with at least one ion detector, determining a level of ion beam charge contamination based on a concentration of the detected ions, and interlocking ion implantation when the level of ion beam charge contamination exceeds a predetermined threshold.

In a further embodiment, an ion implantation interlock system may be provided. The system according to this embodiment may comprise an ion beam scanner for scanning an ion beam across a target substrate, at least one ion detector located at an end station and positioned along an ion trajectory off of a trajectory of the ion beam, and a control program stored in a computer readable storage device in electrical communication with the at least one ion detector that, based on out-trajectory ions detected by the at least one ion detector, determines a level of ion beam contamination, and interlocks ion implantation when the level of ion beam contamination exceeds a predetermined threshold The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 2 is a schematic block diagram of an exemplary ion implantation system including beamline component details according to various embodiments of the present disclosure.

FIG. 3 illustrates an ion beam contamination detection system for an ion implantation system using a $P^{3+}$ ion beam according to various embodiments of the disclosure.

FIG. 4 illustrates an ion beam contamination detection system for an ion implantation system using a $P^{2+}$ ion beam according to various embodiments of the disclosure.

DETAILED DESCRIPTION OF EXEMPLARY EMBODIMENTS

Figure 1:
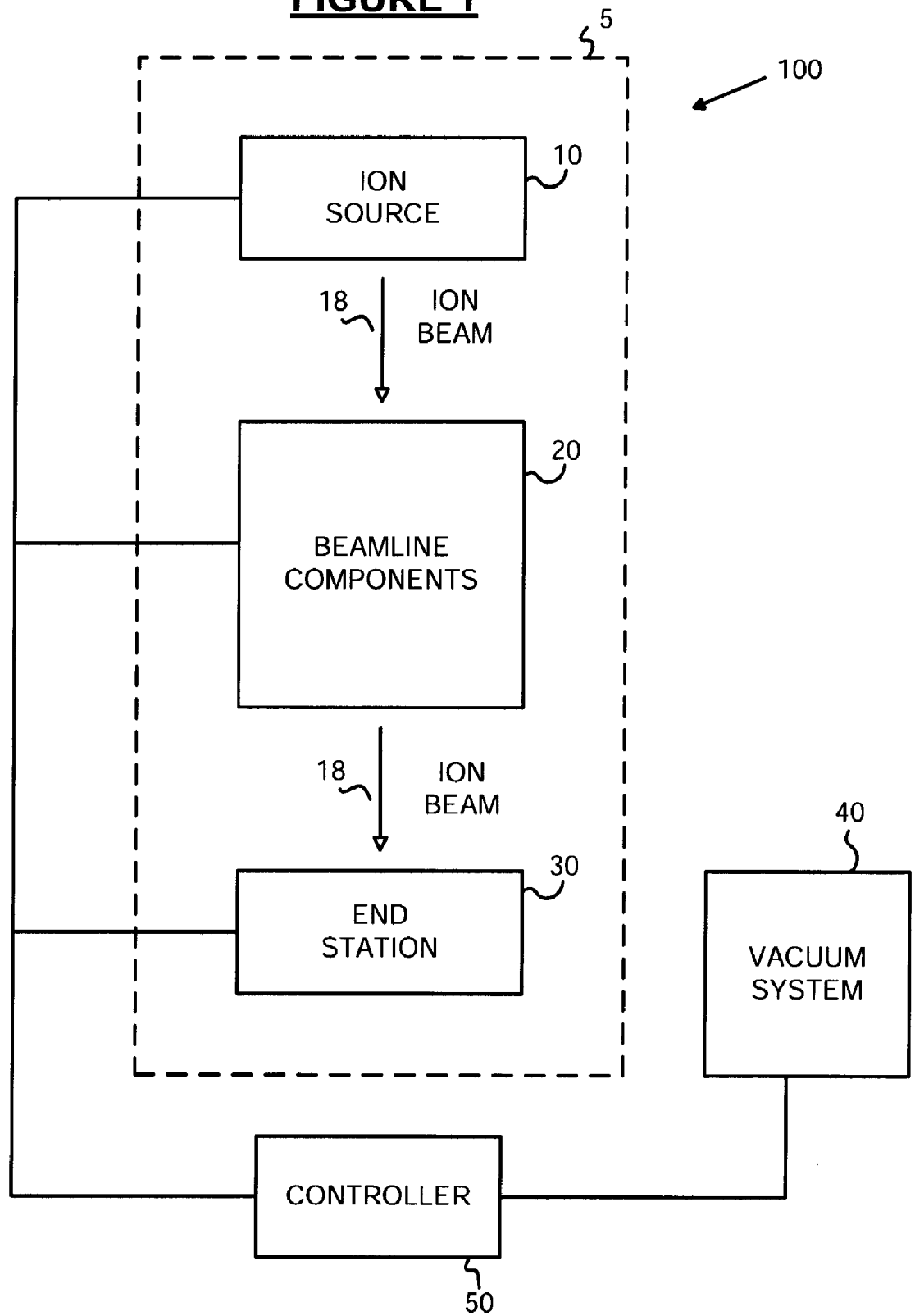
FIG. 1 is a schematic block diagram of an ion implantation system usable with various embodiments of the present disclosure.

FIG. 1 is a schematic block diagram of an ion implantation system 100 usable with various embodiments of the present disclosure. The ion implantation system 100 includes an ion source 10 that generates an ion beam 18. The ion source 10 may include various different types of components and systems to generate the ion beam 18, such as is discussed in greater detail in the context of FIG. 2. The ion beam 18 can be any type of charged particle beam, such as an energetic ion beam used to implant semiconductor wafers.

The ion implantation system 100 also includes one or more beamline components 20 for conditioning the ion beam 18 to have the appropriate energy and to contain the desired ion species, as well as to shape the beam and convert it into a scanning beam for increasing dosimetry accuracy. The beamline components 20 process the ion beam 18 and direct the ion beam 18 towards an end station 30. The end station 30 may contain a platen (see 32 in FIG. 2) for holding one or more wafers or other work pieces and a drive system for moving the one or more wafers with respect to the ion beam 18 and also for moving them in and out of the end station 30. The ion source 10, beamline components 20, and end station 30 are typically contained within a vacuum chamber 5. The ion implantation system 100 also includes a vacuum system 40 for maintaining vacuum pressure in the chamber 5, and a controller 50, such as a computer, for controlling the various controllable elements of the ion implantation system 100 for performing one or more ion implantation processes.

The end station 30 may also comprise one or more ion detectors (see 33, 34, 35 in FIG. 2) for detecting an ion beam current (i.e., an amount of charge carried by particles in the ion beam 18). As is known by those skilled in the art, a Faraday type detector is typically used to detect ion dosage. In such a detector, sometimes referred to as a Faraday cup, ions hitting the "cup" charge the cup. The metal of the cup can then be discharged to measure a current equivalent to the number of discharged ions. It should be appreciated that any type of ion beam current detector may be used with the various embodiments of the disclosure. For example, other types of devices may be used to measure the ion beam current, such as devices that use calorimetery or beam-induced magnetic field measurement. The one or more ion detectors may be in electrical communication with the controller 50 to provide real time data to a control program that can make process adjustments in response to detected changes in ion dosage level.

The controller 50 can be or include a general purpose computer or network of general purpose computers that are programmed to perform desired input/output and other functions. The controller 50 can also include other electronic circuitry or components, such as application specific integrated circuits (e.g., ASICs), other hardwired or programmable electronic devices, discrete element circuits, FPGAs, etc. The controller 50 can also include devices, such as user input/output devices (e.g., keyboards, touch screens, user pointing devices, displays, printers, etc.), communication devices, data storage devices, mechanical drive systems, etc., to perform desired functions.

The vacuum system 40 may communicate with the controller 50, e.g., to provide information to the controller 50 regarding a current vacuum level in one or more portions of the chamber 5 during an ion implantation process. The vacuum system 40 may include one or more pressure sensors (not shown) that monitor pressure in the chamber 5 and that communicate pressure readings to the controller 50. Alternatively, these pressure sensors may be separate from the vacuum system 40 and in communication directly with the controller 50.

Typically, the ion beam 18 is transported from the ion source 10 to the end station 30 in a relatively high vacuum (low pressure) environment created in the chamber 5 by the vacuum system 40. The vacuum system 40 may comprise any number of well-known systems, such as vacuum pumps, vacuum isolation valves, pressure sensors, etc., to maintain the vacuum conditions.

In the exemplary embodiment illustrated in FIG. 1, for ease of illustration, the ion beam 18 is shown as following a straight path from the ion source 10 to the end station 30. It should be appreciated that the ion beam 18 may follow a curved path with one or more deflections in the ion source 10, beamline components 20, and/or in the end station 30, as shown in the exemplary ion implantation system 101 of FIG. 2.

FIG. 2 is a schematic block diagram of an exemplary ion implantation system 101 including beamline component details according to various embodiments of the present disclosure. The system 101 illustrated in FIG. 2 includes the ion beam source 10 that generates the ion beam 18 that is transported through the system 101 and impinges upon a target substrate 31 at the end station 30. The ion beam 18 may comprise a scanning spot ion beam, a ribbon shaped ion beam, or other ion beam shape.

The ion beam source 10 may be connected to an ion source material supply container 11, which may contain gas, solid materials or combinations thereof, from which the ion beam 18 is generated. The ion source material from the supply container 11 may be introduced into the ion source chamber 13 and ionized to generate positive ions and electrons. In various embodiments, the source material in the container 11 may comprise carborane. The most commonly implanted species today are arsenic, phosphorus, boron, boron difluoride, indium, antimony, germanium, silicon, nitrogen, hydrogen, and helium. In various embodiments, the source material may include a hydrogen absorbing material. It should be appreciated that any hydroscopic source material may be utilized with the various embodiments of the disclosure.

In the exemplary system 101 of FIG. 2, ion source material from the source container 11 may enter the chamber an extraction electrode 14 may be used to extract the ion beam 18 from the chamber 12. A filament 13 and extraction electrode 14 may be used to ionize the ion source material and to generate ions that are expelled from the chamber 12. A suppression electrode 15 and ground electrode 16 may be located outside the chamber 12. Typically, the ion source is at a positive potential relative to ground. Thus, positive ions are extracted from the positive ion source. The suppression electrode 15 may be located between the ion source and ground electrode 16 and is usually at a negative potential relative to ground. One reason for this is to reduce the number of negatively charged electrons that would get accelerated toward the ion source and generate x-rays.

The ion implantation system 101 depicted in FIG. 2 may further comprise a source filter 17 that removes undesired species from the ion beam 18. Downstream of source filter 17, the system 101 may include an acceleration/deceleration column 21 in which ions in the ion beam 18 are accelerated/decelerated to a desired energy depending upon the particular implantation application. The system 101 may also comprise a mass analyzer 22 that removes energy and mass contaminants from the ion beam 18 through the use of a field generating component 23 and a resolving aperture 24. The field generating component 23 may comprise a dipole analyzing magnet that operates to provide a magnetic field across a path of the ion beam 18 so as to deflect ions from the ion beam 18 at varying trajectories according to a charge-to-mass ratio of the respective ions in the ion beam 18. Ions traveling through the magnetic field will experience a force that directs individual ions of a desired mass along the path of the ion beam 18 through the resolving aperture 24, deflecting all other ions of undesired mass away from the path of the ion beam 18.

The system 101 may also comprise a scanner 25, such as an electrostatic scanner, that may be positioned downstream of the mass analyzer 22. The scanner 25 may be designed to scan the ion beam 18 across a target substrate 31, such as a semiconductor wafer. The target substrate 31 can take various physical shapes including a common disk shape. The target substrate 31 can include any type of semiconductor material or any other material that is to be implanted using the ion beam 18. The system 101 may also include an angle corrector magnet 26 to deflect ions in the scanned ion beam 18 so that the scanned ion beam 18 has parallel ion trajectories.

Though not depicted in FIG. 2, the system 101 may also include one or more electrostatic filters (not shown) to prevent relatively high energy neutral particles from contaminating the target substrate.

With continued reference to the exemplary ion implantation system 101 depicted in FIG. 2, the end station 30 receives the mass analyzed, substantially decontaminated ion beam 18. As discussed herein, the end station 30 may include a platen 32 that supports one or more target substrates 31 such as semiconductor wafers to be implanted by the ion beam 18. The end station 30 may also comprise a drive system (not shown) for moving the target substrate 31 into and out of the path of the ion beam 18, on and off of the platen 32, and on to subsequent processing stages. The end station 30 may include one or more detectors, such as detectors 33, 34 and 35 for detecting a dose level of ions reaching the target substrate 31.

Though not shown in FIG. 2, the implanter system 101 may also comprise a controller and a vacuum system, such as the controller 50 and vacuum system 40 shown in FIG. 1. The controller may communicate with the drive system at the end station 30 to orient the target substrate 31 with respect to the ion beam 18. For example, the drive system may scan the target substrate 31 through the ion beam 18 so as to implant ions onto the surface of the target substrate 31. The drive system may include various different devices or systems to physically move the target substrate 31 in a desired manner. For example, the drive system may include servo drive motors, solenoids, screw drive mechanisms, one or more air bearings, position encoding devices, mechanical linkages, robotic arms or any other components that are well known in the art to move a target substrate.

It should be understood that systems according to the embodiments of the present disclosure may be used in connection with any ion implantation system or method. Accordingly, the systems 100 and 101 illustrated in FIGS. 1 and 2 may be modified as desired for a particular process. In some cases, the systems 100 and 101 may include additional components than those illustrated. For example, the systems 100 and 101 may include an automated substrate handling system (not shown) for introducing substrates into the process chamber 5 prior to ion implantation and for removing substrates from the process chamber 5 after ion implantation and/or transporting them to other substrate processing equipment. In some cases, systems according to embodiments of the present disclosure may not include all of the illustrated components.

During operation of the ion implantation system 101 according to the various embodiment of the present disclosure, the detectors 33, 34 and 35 can determine a level of ion beam contamination without deliberately scanning the ion beam across of the detectors 33, 34, 35. That is, as opposed to conventional systems that detect ion beam contamination by measuring the beam current of the full ion beam and comparing this to a baseline level—i.e., deliberately scanning the ion beam across the detectors—the systems according to the embodiments of the present disclosure measure contamination by measuring ion levels above zero. If any ions are detected there is some contamination. If the current level of the detected ions exceeds a predetermined level, than process interlock will occur. This is more efficient than conventional systems because the ion beam width does not need to be greater (i.e., less efficient use of the beam and taking more time). To the extent that baseline reading is taken in the systems according to the present embodiment, it is done prior to implantation, when the ion beam 18 is not incident upon the target substrate 31, so that there is no out-gassing and a reading of the current level with the highest vacuum is obtained.

As discussed herein, materials in or on the target substrate 31, such as photoresist on the surface of the target substrate 31, may outgas or otherwise produce gas particles when impacted by particles in the ion beam 18. This causes a vacuum fluctuation within the chamber that can cause the vacuum level to decrease near the target substrate 31 and along the beamline. This decrease in vacuum level can cause an increase in the number of charge exchanging interactions that occur for particles in the ion beam 18 traveling to the target substrate 31. For example, singly positively charged ions in the ion beam 18 may be neutralized by interactions along the beamline, or the singly positively charged ions may be ionized to doubly positively charged. Although the charge of the ions can be altered, the energy of the particles is not substantially changed. Therefore, ions other than those of the ion beam 18 may impact the target substrate 31 and contribute to the overall impurity dosing of the target substrate 31. Also, because differently charged ions are effected differently by the corrector magnet 26, only some of the ions may reach the target substrate 31 leading to dosimetry errors.

FIG. 3 illustrates an ion beam contamination detection system for an ion implantation system using a $P^{3+}$ ion beam according to an embodiment of the present disclosure. Similarly, FIG. 4 illustrates an ion beam contamination detection system for an ion implantation system using a $P^{2+}$ ion beam according to an embodiment of the present disclosure. In the example of FIG. 3, the ion beam 18 containing triple charged $P^{3+}$ ions enters the angle correcting magnet 26. Ions in the ion beam 18 having the $P^{3+}$ charge state are directed by the magnetic field generated by the corrector magnet 26 to the target substrate 31. Ions in the ion beam 18 that have undergone neutralization, that is from charge state $P^{3+}$ to $P^{2+}$, are less affected by the magnetic field. Therefore, the trajectory of these ions is less altered in the presence of the magnetic field. As shown in FIG. 3, some of the ions may alter the dosage uniformity of the target substrate 31 at the edges thereof. In various embodiments, one or more ion detectors 33, 34, and 35 may be positioned off of and slightly behind the target substrate 31 in order to detect ions having a lower charge state than that of the ion beam 18. The one or more ion detectors 33, 34, and 35 may be profiling detectors such as Faraday type detectors, that are angled with respect to the primary ion beam and have a low beam acceptance angle. Alternatively, or in addition, the one or more ion detectors 33, 34, 35 may be positioned at specific angles to detect specific ions. For example one or more of the ion detectors 33, 34, 35 may positioned at an angle to detect P2+ ions in a P3+ ion beam or P+ ions in an P2+ ion beam. In various embodiments, the detected ion beam current is received by a controller of the ion implantation system. The controller may execute a control program that, based on the detected current level of the relatively more neutral ions, determines a contamination level of the ion beam 18. In various embodiments, in the example of FIG. 3, the controller may use a scale factor or other look-up to determine, based on the detected $P^{2+}$ ion current, a level of $P^{4+}$ ion current, that is, ions that have lost an electron. In various embodiments, if the ion beam contamination level exceeds a predetermined level, the controller may interlock implantation by causing the scanner to pause off of the target substrate 31 until a causative condition, such as loss of vacuum, has been corrected. By measuring the current of the relatively more neutral ions, on a trajectory off of the trajectory of the ion beam 18, the level of beam contamination may be monitored with high accuracy. In addition, one or more ion detectors 36 may be positioned in or near the plane of the platen 32 on the primary beam trajectory. The system may then measure a ratio of off-trajectory beam current to on-trajectory current and interlock ion implantation when this ratio exceeds a predetermined or operator specified value.

Likewise, in the example of FIG. 4, an implantation process is performed with the ion beam 18 having a charge state of $P^{2+}$. In this example, the ion beam 18 entering the corrector magnet 26 includes ions that have undergone charge neutralization and ionization interactions creating $P^+$ and $P^{3+}$ ions. With the corrector magnet field set for $P^{2+}$ ions, the relatively more neutral $P^+$ ions are under affected and, as a result, mostly undershoot the target substrate 31. The one or more ion detectors 33, 34, and 35 are able to detect an ion current of these relatively more neutral $P^+$ ions. This detection data is supplied to the controller so that the controller can monitor in real-time the contamination of the $P^{2+}$ ion beam. As in the example of FIG. 3, if the contamination level exceeds a predetermined threshold, the controller may cause the scanner 25 to move away from or pause off of the target substrate 31, momentarily, such as, for example, until vacuum has been restored or for a predetermine time period (e.g., N milliseconds).

In addition to detecting the ion beam current of the out-trajectory ions, various embodiments of the disclosure can, based on a distribution of the out-trajectory ion beam current, determine where the beam contamination is occurring.

Figure 5:
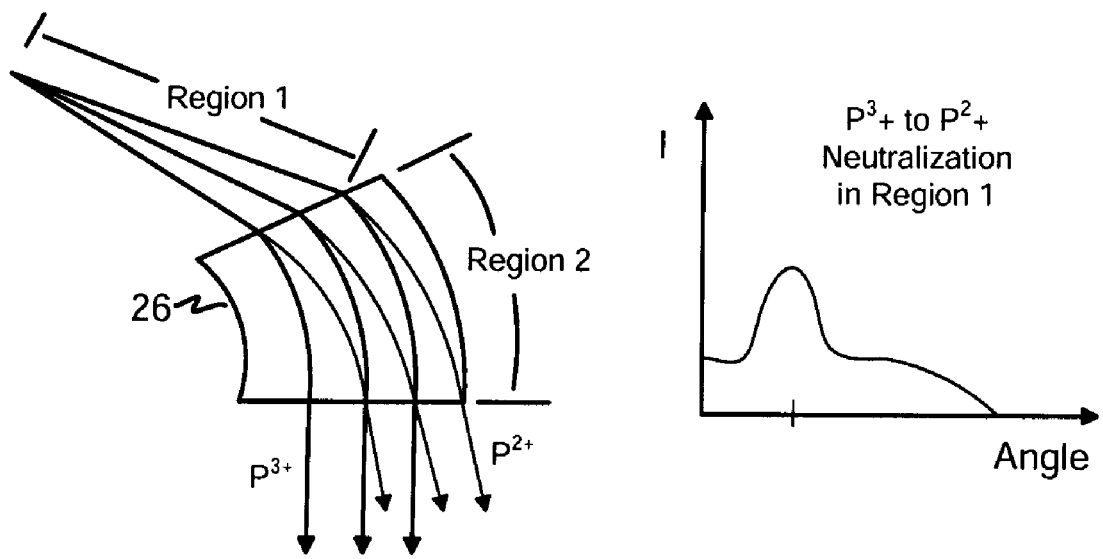
FIG. 5 illustrates the affect of beamline contamination when such contamination occurs before beamline components, and the resulting current distribution of ions reaching the out-target detector(s).

Referring now to FIG. 5, this example illustrates the effect of beamline contamination when such contamination occurs before beamline components, and the resulting current distribution. This is analogous to the examples of FIGS. 3 and 4. When relatively more neutral ions enter the corrector magnet 26 having already undergone charge state changing interactions, this results in uniform deflection off of the trajectory of the ion beam 18 causing the ion detector(s) 33, 34, 35 to show an ion beam current distribution consistent with a secondary ion beam. Thus, the ion beam 18 will be split by the corrector magnet 26 into two beams $P^{3+}$ and $P^{2+}$, respectively, at different angles with respect to the target substrate 31. The ion beam current data supplied to the controller in such a case will show the secondary ion beam centered at a particular angle with respect to normal of the target substrate 31. The controller may make one or more adjustments to ion implantation parameters based on this type of ion current distribution. For example, the controller may adjust specific implantation parameters, such as a beam scan rate, beam current level, wafer scan rate, etc., as is discussed in commonly assigned U.S. Pat. No. 6,323,497, which is hereby incorporated by reference herein, in its entirety. Alternatively, or in addition, the controller may output a signal to the vacuum system indicating that a rise in vacuum pressure has been detected and that the vacuum level within the chamber should be adjusted accordingly. This signal to the vacuum system may be provided in addition to measured vacuum level signals provided by pressure sensors to the vacuum system.

Figure 6:
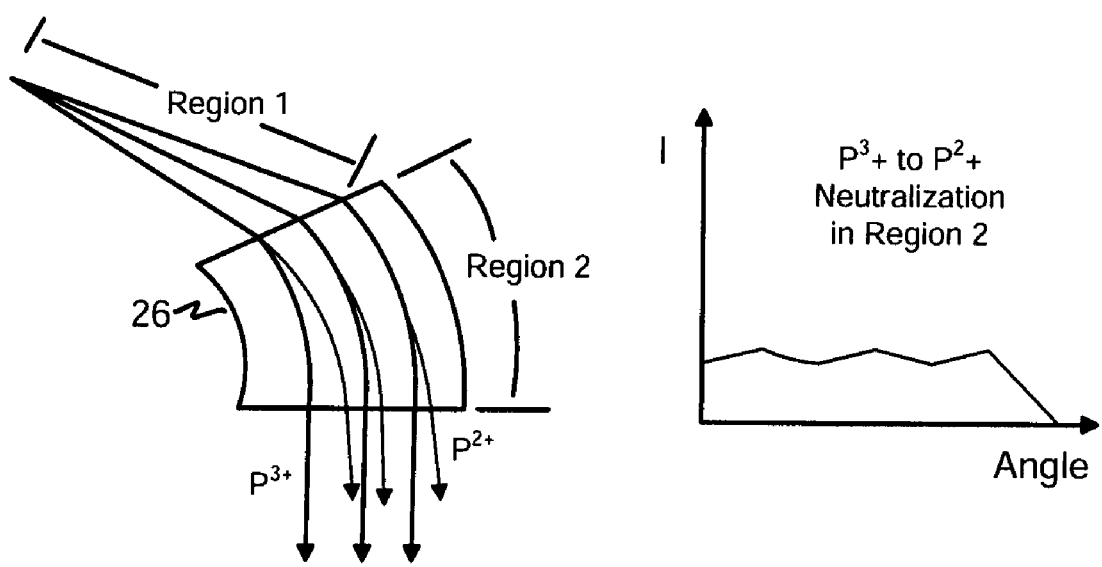
FIG. 6 illustrates the affect of beamline contamination when such contamination occurs in beamline components, and the resulting current distribution of ions reaching the out-target detector(s).

Referring to FIG. 6, this example illustrates the affect of beamline contamination when such contamination occurs in the corrector magnet 26, and the resulting current distribution. Because charge neutralization interactions may occur at varying locations within the corrector magnet 26, the resulting deflection pattern is more spray-like than uniform, falling over a range of angles with respect to normal of the target substrate 31. This may be picked up by the one or more out-trajectory ion detector(s) 33, 34, 35, as a more random distribution than a peak at a second trajectory angle as shown in the graph of FIG. 6. Accordingly, based on this type of data from the ion beam current detectors, the controller can determine that the problem is in the corrector magnet 26 rather than further up the beamline. This may cause the controller to make an adjustment to one or more ion implantation parameters, such as a beam scan rate, beam current level, wafer scan rate, etc.

Figure 7:
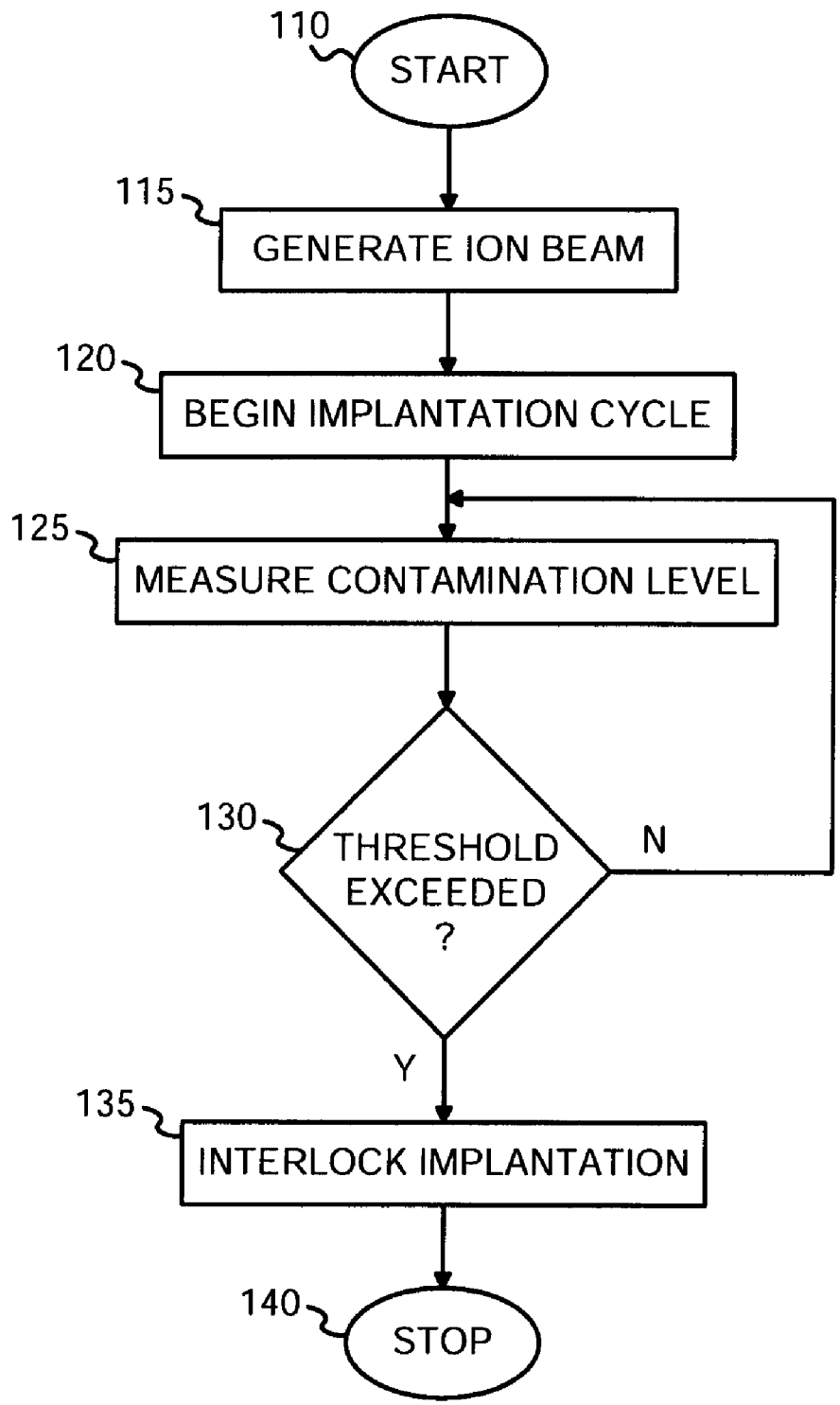
FIG. 7 is a flow chart detailing the steps of a method for measuring contamination within an ion beam and performing ion implantation interlock when contamination exceeds a predetermined level according to various embodiments of the present disclosure.

FIG. 7 is a flow chart detailing the steps of a method for measuring contamination within an ion beam, and performing ion implantation interlock when contamination exceeds a predetermined level according to various embodiments of the present disclosure. The method begins in step 110 and proceeds to step 115. In step 115, an ion beam is generated. Ion beam generation techniques are well known in the art. As discussed herein, this may comprise generating a scanning spot beam of a desired energy and of a particular ion species with one or more beamline components. In step 120, an ion implantation cycle is begun. In various embodiments, ion implantation is performed in accordance with one or more predetermined cycles or programs. These programs are a "recipe" for creating a substrate having the desired material properties. The programs may include information such as beam angle, scan rate, scan pattern, beam current level, and time of beam exposure.

Next, in block 125, as implantation is performed, the contamination level of the ion beam may be measured. In various embodiments, this comprises detecting an ion beam current of an out-trajectory ion beam. For example, as shown in FIGS. 3 and 4 and discussed in the corresponding description, one or more ion detectors may be placed at angles corresponding to the trajectory of ions having a charge state relatively more neutral than the ions of the ion beam 18. These detectors may supply ion beam current data for out-trajectory ions to a controller of the ion implantation system. The controller may, based on the value of the detected ion beam current, determine an amount of ion beam contamination.

In step 130, a determination is made by the controller as to whether or not the level of ion beam current contamination exceeds a predetermined threshold level. If the controller determines that the ion beam current contamination exceeds a predetermined threshold, operation may proceed to step 135. Otherwise, operation may return to step 125, wherein the information from the one or more ion current detectors is continuously monitored by the controller. The ion implantation process may be continued until all regions having the desired dopant concentration and implant depth are formed within the target substrate 31.

In step 135, the controller may initiate an ion implantation interlock function to prevent damage to the target substrate 31. As discussed herein, this may comprise pausing ion implantation with the scanner 25 off of the target substrate 31. Ion implantation may be paused for a predetermined time period (e.g., N seconds, N milliseconds, etc.). Alternatively, ion implantation may be paused until the controller determines that a condition responsible for the contamination has been resolved. For example, waiting a few seconds (e.g., 1-3) will allow the vacuum to recover and the contamination level to reduce. As noted herein, the contamination level is strongly correlated to the vacuum level (e.g., loss of vacuum increases contamination), which is affected by wafer outgassing. Operation of the method stops in block 140.

In addition to monitoring real time ion implantation, the various systems and methods disclosed herein may be used to calibrate overall performance of an ion implantation system as well as an interlock system. In various embodiments, different ion beam current detector angles may be used with respect to a target substrate normal depending upon the charge state of an ion beam. For example, in a $P^{3+}$ ion implantation process, detectors may be oriented at different angles with respect to the target substrate normal than in a $P^{2+}$ ion implantation process. Also, one or more detectors 33, 34, 35 may be rotated through a range of trajectories to determine a location of contamination based on a trajectory having the highest concentration of ion particles. Additionally, as discussed herein, the particular current distribution detected by the one or more detectors may allow the controller to determine if charge exchange interactions are occurring within line-of-sight of the target substrate, such as in the corrector magnet, or further up the beamline, i.e., in a drift region, in the scanner, in pre-scanner drift regions. In various embodiments, this information may be communicated by the controller to an operating interface of the ion implantation system so that an operator may be made aware of the location of the charge exchange interactions. The controller may also output a message to the interface and/or to a log file whenever the interlock system engages in response to a determination that the ion beam contamination has exceeded a predetermined level. The controller may also adjust one or more ion implantation parameters such as beam scan rate, beam current level, wafer scan rate, etc.

At this point it should be noted that detecting ion beam charge contamination and performing ion implantation interlock in accordance with the present disclosure as described above typically involves the processing of input data and the generation of output data to some extent. This input data processing and output data generation may be implemented in hardware or software. For example, specific electronic components may be employed in a controller or similar or related circuitry for implementing the functions associated with detecting ion beam charge contamination and performing ion implantation interlock in accordance with the present disclosure as described above. Alternatively, one or more processors operating in accordance with stored instructions may implement the functions associated with detecting ion beam charge contamination and performing ion implantation interlock in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method of operating an ion implantation system comprising:
   generating an ion beam of a primary charge state;
   projecting the ion beam onto a target substrate;
   detecting off angle ions on trajectories off the target substrate, wherein a concentration of the off angle ions indicates an amount of charge contamination within the ion beam; and
   interlocking ion implantation when the amount of charge contamination exceeds or equals a predetermined threshold.

2. The method according to claim 1, wherein detecting off angle ions comprises locating at least one ion detector at a trajectory off of the target substrate.

3. The method according to claim 2, wherein locating at least one ion detector at a trajectory off of the target substrate comprises locating at least one ion detector on an outside trajectory of a corrector magnet.

4. The method according to claim 2, wherein locating at least one ion detector at a trajectory off of the target substrate comprises locating at least one ion detector on an inside trajectory of a corrector magnet.

5. The method according to claim 2, wherein locating at least one ion detector at a trajectory off of the target substrate comprises locating at least one ion detector at a trajectory based at least in part on the primary charge state of the ion beam.

6. The method according to claim 2, wherein locating at least one ion detector at a trajectory off of the target substrate comprises rotating at least one ion detector through a range of trajectories and determining a location of contamination based on a trajectory having the highest detected beam current.

7. The method according to claim 1, wherein interlocking ion implantation comprises pausing implantation with the ion beam off of the target substrate until a condition contributing to the off angle ions is mitigated.

8. The method according to claim 1, wherein interlocking ion implantation comprises generating an alert on a user interface integral to the ion implantation system.

9. The method according to claim 8, wherein generating an alert comprises determining, based on a pattern of the detected off angle ions, a contamination location and outputting the location via the interface.

10. A method of detecting ion beam contamination in an ion implantation system comprising:
   detecting ions on trajectories off of a target substrate with at least one ion detector;
   determining a level of ion beam charge contamination based on a concentration of the detected ions; and
   interlocking ion implantation when the level of ion beam charge contamination exceeds a predetermined threshold.

11. The method according to claim 10, wherein interlocking ion implantation comprises pausing ion implantation by scanning the ion beam off of the target substrate until a condition causing the ion beam charge contamination has been mitigated.

12. The method according to claim 10, wherein interlocking ion implantation comprises generating an alert on an interface integral to the ion implantation system.

13. The method according to claim 12, wherein interlocking ion implantation comprises determining, based in part on the detected ions, a location of the ion beam charge contamination, and outputting the location via the interface.

14. The method according to claim 10, wherein determining a level of ion beam charge contamination based on a concentration of the detected ions comprises locating at least one ion detector at a trajectory off of the target substrate and measuring a ratio of off-target ion beam current to primary beam current.

15. The method according to claim 14, wherein locating at least one ion detector at a trajectory off of the target substrate comprises locating at least one ion detector on an outside trajectory of a corrector magnet of the ion implantation system.

16. The method according to claim 14, wherein locating at least one ion detector at a trajectory off of the target substrate comprises locating at least one ion detector on an inside trajectory of a corrector magnet of the ion implantation system.

17. The method according to claim 14, wherein locating at least one ion detector at a trajectory off of the target substrate comprises rotating at least one ion detector through a range of trajectories and determining a location of ion beam charge contamination based on a trajectory having a highest ion beam current.

18. An ion implantation interlock system comprising:
   an ion beam scanner for scanning an ion beam across a target substrate;
   at least one ion detector located at an end station and positioned along an ion trajectory off of a trajectory of the ion beam; and
   a control program stored in a computer readable storage device in electrical communication with the at least one ion detector that, based on out-trajectory ions detected by the at least one ion detector, determines a level of ion beam contamination, and interlocks ion implantation when the level of ion beam contamination exceeds a predetermined threshold.

19. The system according to claim 18, wherein interlocking ion implantation comprises pausing ion implantation with the ion beam off of the target substrate until a condition causing the ion beam contamination has been mitigated.

20. The system according to claim 18, wherein interlocking ion implantation comprises generating an alert on an interface in electrical communication with the control program.

21. The system according to claim 20, wherein interlocking ion implantation comprises determining, based at least in part on a pattern of the off trajectory ions and a charge state of the ion beam, a source of the ion beam contamination and providing information identifying the source via the interface.

* * * * *